United States Patent [19]

Bartur

[11] Patent Number: 5,135,878
[45] Date of Patent: Aug. 4, 1992

[54] SCHOTTKY DIODE

[75] Inventor: Meir Bartur, Brentwood, Calif.

[73] Assignee: Solid State Devices, Inc., La Mirada, Calif.

[21] Appl. No.: 573,957

[22] Filed: Aug. 28, 1990

[51] Int. Cl.$^5$ .................. H01L 21/265; H01L 21/44; H01L 21/18

[52] U.S. Cl. ..................................... 437/39; 437/177; 437/208; 437/906

[58] Field of Search ............... 437/39, 177, 178, 179, 437/188, 208, 906; 148/DIG. 140; 357/15

[56] References Cited

U.S. PATENT DOCUMENTS

| | | | |
|---|---|---|---|
| 3,274,454 | 9/1966 | Haberencht | 437/208 |
| 3,698,080 | 10/1972 | Berner | 437/208 |
| 4,110,488 | 8/1978 | Risko | 357/15 |
| 4,400,868 | 8/1983 | Antypas et al. | 437/208 |
| 4,510,672 | 4/1985 | Yakura | 437/208 |
| 4,765,845 | 8/1988 | Takada et al. | 357/71 |
| 4,876,221 | 10/1989 | Hatada | 437/183 |
| 4,912,543 | 3/1990 | Nepple et al. | 357/71 |
| 4,950,623 | 8/1991 | Dishon | 437/183 |

FOREIGN PATENT DOCUMENTS 0085873  7/1981  Japan ..................................... 357/15

OTHER PUBLICATIONS

Neppl. et al., "Barrier Properties of TaSi$_2$ in Contact with Al Metalization Thin Film and Interfaces II. Proceedings of the Symposium" Editor Baglin et al., pp. 587-592.

E. Kolawa et al., "Amorphous Ta—Si—N Thin-Film Alloys as Diffusion Barrier in Al/Si Metallizations", J. Vac. Sci. Technol. A 8(3), 3006, May-Jun., 1990.

M-A. Nicolet et al., "Diffusion Barriers in Layered Contact Structures", J. Vac. Sci. Technol., 19(3), 786, Sep./Oct. 1981.

Primary Examiner—Olik Chaudhuri
Assistant Examiner—Loc Q. Trinh
Attorney, Agent, or Firm—Spensley, Horn, Jubas & Lubitz

[57] ABSTRACT

A Schottky diode has a metal lead electrically connected to the Schottky contact layer wherein the metal lead is metallurgically bonded to the diode for increased reliability, the diode having a Ta—Si—N barrier layer.

25 Claims, 4 Drawing Sheets

SCHOTTKY DIODE

BACKGROUND OF THE INVENTION

1. Field of the Invention

The present invention relates to Schottky diodes, and more particularly, to Schottky diodes constructed for high reliability applications.

2. Description of Related Art

A Schottky diode comprises a semiconductor substrate and a metal contact layer deposited on the substrate to form a Schottky barrier at the metal-semiconductor interface. Typically, a separate metallization layer is insulatively disposed over the substrate to provide an electrical contact to the Schottky contact layer. Optionally, a separate diffusion barrier layer can be interposed between the metallization layer and the underlying Schottky contact layer to prevent interdiffusion of the metallization layer with the Schottky contact layer and the semiconductor substrate.

In high current applications, the Schottky contact layer may occupy a majority of the top surface of the semiconductor substrate. Current handling capacity can also be increased by connecting the external leads to the diode so that the current is directed vertically through the semiconductor substrate. For example, if one external lead is electrically connected to the top metallization layer and a second external lead is connected to a metallization layer on the bottom surface of the substrate, current will flow generally vertically through the device.

In some applications, it is important for the diode assembly including the leads to the Schottky diode to be able to withstand a variety of mechanical forces including vibration, torsion, compression, stresses due to temperature shock and temperature cycling, etc., while maintaining good electrical contact to the Schottky diode. Often, the bottom lead is metallurgically bonded to the bottom metallization layer. Metallurgical bonding can provide a very strong mechanical connection as well as good electrical and heat conduction to the diode. However, because of the proximity of the Schottky contact layer to the top metallization layer, the top external lead has not generally been metallurgically bonded to the top metallization layer. Known Schottky diodes are not believed to be able to withstand metallurgical bonding of the top lead without destruction or serious degradation of the Schottky contact layer.

In some prior designs, the top lead is mechanically compressed against the top metallization layer. For example, after bonding the bottom lead to the bottom of the substrate, the top lead is abutted against the top metallization layer of the diode. The Schottky diode and the ends of the top and bottom leads are then encased in a glass sleeve which is subsequently heated and shrunk providing a strong contact pressure between the top lead and the top metallization layer of the diode. This pressure contact between the top lead and the top metallization layer of the diode is often not as strong or reliable as a metallurgical bond.

SUMMARY OF THE INVENTION

It is an object of the present invention to provide an improved Schottky diode, obviating, for practical purposes, the above-mentioned limitations, particularly in a manner requiring a relatively uncomplicated arrangement.

These and other objects and advantages are achieved in a Schottky diode having a diffusion barrier layer of tantalum-silicon-nitride between the underlying semiconductor substrate and an overlying metallization layer. A metal lead placed in proximity to the top metallization layer is heated with the metallization layer to a degree such that the metal lead metallurgically bonds to the metallization layer. Such an arrangement has been found to provide a Schottky diode having a very strong and reliable interconnection between the diode and the top lead while preserving the integrity of the diode from any deleterious effects of the metallurgical bonding process.

In another aspect of the invention, a plurality of Schottky barrier diodes having a diffusion barrier layer of Ta-Si-N may be stacked together, one on top of another, each diode having top and bottom metallization layers. The stack of diodes may then be heated to a degree such that the contacting metallization layers metallurgically bond to each other, thereby electrically connecting the stack of Schottky diodes in series and providing a strong, reliable bond between adjacent diodes of the stack. Such an arrangement provides a composite Schottky device which is particularly well adapted for high voltage, high reliability applications.

DETAILED DESCRIPTION OF THE INVENTION

Figure 1:
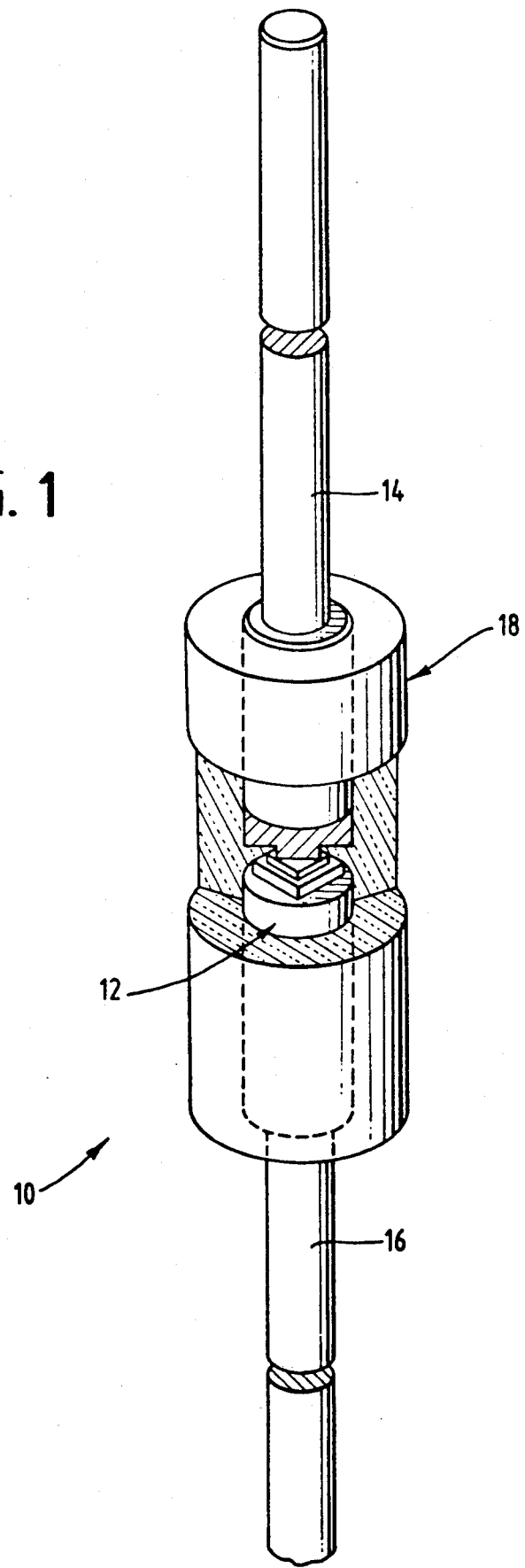
FIG. 1 is a perspective view of a Schottky diode packaged in accordance with a preferred embodiment of the present invention, with a portion broken away for purposes of clarity.

A Schottky device in accordance with a preferred embodiment of the present invention is indicated generally at 10 in FIG. 1. The device 10 includes a Schottky diode 12 packaged with a top lead 14 and a bottom lead 16. The ends of the leads 14 and 16 together with the Schottky diode 12 are encased in a glass sleeve 18 which hermetically seals the diode 12 and the junctions between the diode 12 and the ends of the top and bottom leads 14 and 16. As explained in greater detail below, the top and bottom leads 14 and 16 are metallurgically bonded to the top and bottom, respectively, of the diode 12 to provide a very strong and reliable mechanical and electrical connection between the leads 14 and 16 and the respective surfaces of the diode 12.

Figure 2:
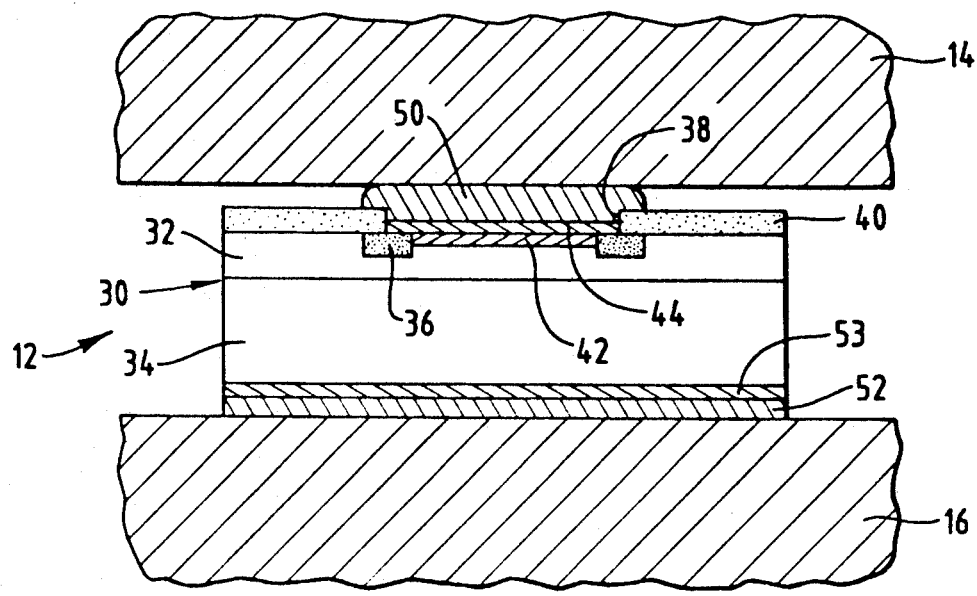
FIG. 2 is a cross-sectional view of a Schottky diode and top and bottom leads before the leads are metallurgically bonded to the diode.

FIG. 2 shows a cross-section of the Schottky diode die before the leads 14 and 16 are metallurgically bonded to the diode. In the illustrated embodiment, the diode 12 has a silicon substrate 30 which includes an n-type (or alternatively, intrinsic) epitaxial layer 32 which overlies an n+type layer 34. For high voltage applications, the height of the substrate 30 typically ranges from 100-1000 $\mu$.

Formed within the epitaxial layer 32 is a guard ring 36 which increases the voltage handling capabilities of the diode. The position of the guard ring 36 is defined by an aperture 38 formed in an overlying insulative layer 40 of silicon dioxide. The guard ring 36 may be eliminated in some applications such as those not requiring a high breakdown voltage or fast switching speed, for example. Within the guard ring 36, a Schottky contact layer 42 is formed. In the illustrated embodiment, the contact layer 42 comprises an amorphous thin film alloy, preferably tungsten silicon nitride. Other contact metals may be used such as gold, platinum, etc.

Overlying the Schottky contact layer 42 and a portion of the guard ring 36 and within the boundaries of the aperture 38 of the silicon dioxide insulating layer 40, a diffusion barrier layer 44 is formed. In the illustrated embodiment, the diffusion barrier layer 44 comprises a 100 nm amorphous $Ta_{36}Si_{14}N_{50}$ alloy film.

Formed in turn on the diffusion barrier layer 44 is a top metallization layer 50. The bottom surface of the substrate 30 also has a metallization layer 52. In the illustrated embodiment, the metallization layers 50 and 52 are preferably silver or aluminum or a mixture thereof but is anticipated that a variety of other good electrically conductive metals may be used as well.

If desired, a second barrier layer 53 can be interposed between the substrate 30 and the bottom metallization layer 52 to limit the encroachment of the metal into the substrate 30 during the metallurgical bonding process. Preferably, the second barrier layer 53 is formed of Ti-Cr-Al or T-W-Al, but other known barrier layers may be used as well.

Each of the layers 40, 44 and 50 are prepared by Rf sputtering. As described in a paper published by E. Kolawa et al., entitled "Amorphous Ta-Si-N thin-film alloys as diffusion barrier in Al/Si metallizations", Journal of Vacuum Science and Technology A, Vol. 813, May-June 1990; pp. 3006-3010, incorporated herein by reference, a vacuum chamber is evacuated to a base pressure of approximately $5 \times 10^{-7}$ Torr before deposition. The vacuum system comprises a cryopump with a cryogenic shield. A magnetron-type circular cathode, 7.5 cm in diameter, with a cathode-to-substrate spacing of 7 cm is used as a sputtering source. The substrate holder need not be heated or cooled externally. The individual layers may be sputtered sequentially in the chamber without breaking vacuum. The W-Si-N and Ta-Si-N layers are formed by reactive sputtering of composite $W_5Si_3$ and $Ta_5Si_3$ targets in a nitrogen enriched argon plasma. Deposition conditions for each layer include a nitrogen flow of 3-10% in argon, a pressure of 10 m Torr, and a power setting of between 100-300 W. The bottom layers 52 and 53 may also be formed by Rf sputtering.

The diode 12 is cut from the wafer to form a die as shown in FIG. 2 and is annealed by thermal annealing in a high vacuum furnace, base pressure $7 \times 10^{-7}$ Torr, at a temperature preferably between 400° C. and 700° C. for 20 minutes. The diode die is then compressed between the ends of the top and bottom leads 14 and 16 in a suitable jig. The top layer 50 has a thickness of approximately 10 $\mu$ or more in the illustrated embodiment to protect the diode against cracking from the applied compressive forces. The leads 14 and 16 are preferably made of aluminum but again, it is recognized that a variety of other conductive metals may be used including tungsten plated with nickel and silver or copper clad. The diode 12 and the ends of the leads 14 and 16 are then coated with a glass slurry or alternatively are encased in a glass sleeve.

Figure 3:
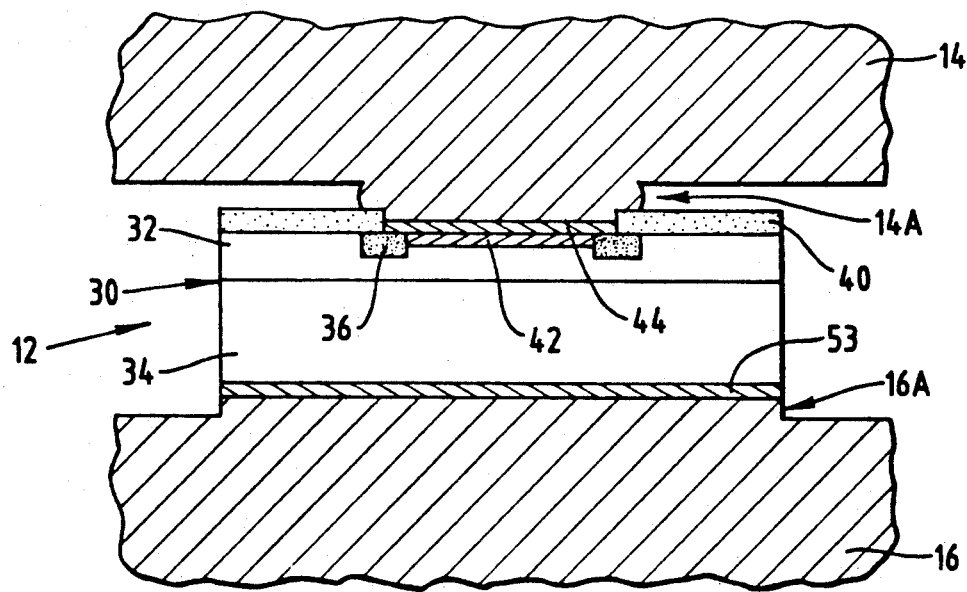
FIG. 3 is a cross-sectional view of a Schottky diode after the top and bottom leads are metallurgically bonded to the diode.
Figure 4:
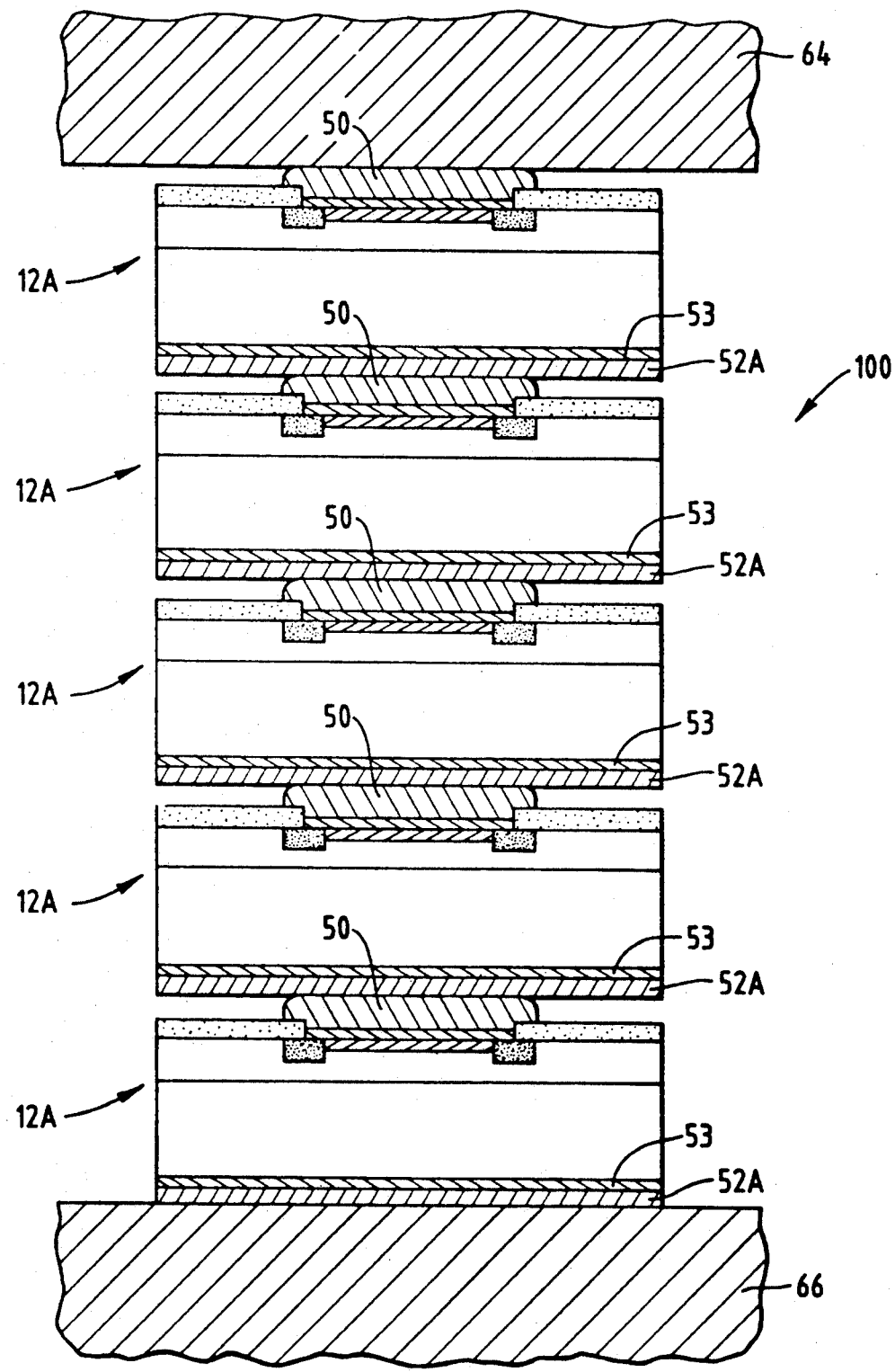
FIG. 4 is a cross-sectional view of a stack of Schottky diodes before the stack is metallurgically bonded.

Upon heating the device above the eutectic temperature of silver and aluminum (567° C.), the top lead 14 metallurgically bonds to the top metallization layer 50, consuming the silver of the metallization layer in the process. Consequently, the lead 14 metallurgically bonds to the top of the diode 12 as shown at 14A in FIG. 3. Similarly, the bottom lead 16 metallurgically bonds to the bottom of the substrate 30 as indicated at 16A. The metallurgical bond of the lead 14 to the diode 12 provides a very strong and very reliable coupling between the lead 14 and the diode 12. Because of the barrier properties of the tantalum silicon nitride layer 44, the Schottky contact layer 42 is not contaminated by molten metal during the metallurgical bonding process, even if heated in excess of 660° C., the melting point of aluminum An alternative embodiment is described in connection with FIGS. 4 and 5. Referring first to FIG. 4, a stack of diode dies 12A is shown. Each diode 12A is formed in a manner similar to that of the diode 12 of FIG. 2. In the illustrated embodiment, the primary difference between the diode 12A of FIG. 4 and the diode 12 of FIG. 2 is that the bottom metallization layer 52A of each diode 12A is preferably formed of aluminum rather than silver. The bottom aluminum metallization layer 52A of each diode 12A (except the bottom-most diode) abuts the top silver metallization layer 50 of the underlying diode of the stack.

The vertical stack of diodes may then be compressed between the ends of top and bottom leads 64 and 66 in a suitable jig in a manner similar to that of the embodiment of FIG. 2. A glass sleeve (not shown) may also be placed around the stack 100 of diodes and the ends of the leads 64,66.

The resulting assembly is then heated to a temperature in excess of the eutectic temperature of aluminum and silver such that the top and bottom metallization layers of adjacent diodes metallurgically bond the adjacent diodes of the stack together in a series connection. At the same time, the top lead 64 metallurgically bonds to the top diode of the stack while the bottom lead 66 metallurgically bonds to the bottom of the bottom diode of the stack. Still further, the simultaneous heating of the glass sleeve hermetically seals the entire device in the glass sleeve (not shown).

In this manner, the diodes 12A are electrically connected in series and are firmly mechanically bonded not only to each other but to the leads as well. In addition to forming the metallurgical bonds, the device is hermetically sealed, all in one heating step.

Such a device is particularly well suited for very high voltage applications requiring a large breakdown voltage. The number of diodes in the stack may be varied depending upon the size of the breakdown voltage required. In addition, "dummy diodes" comprising highly conductive junctionless substrates can be substituted for the top and bottom Schottky diodes of the stack to further increase reliability.

Figure 5:
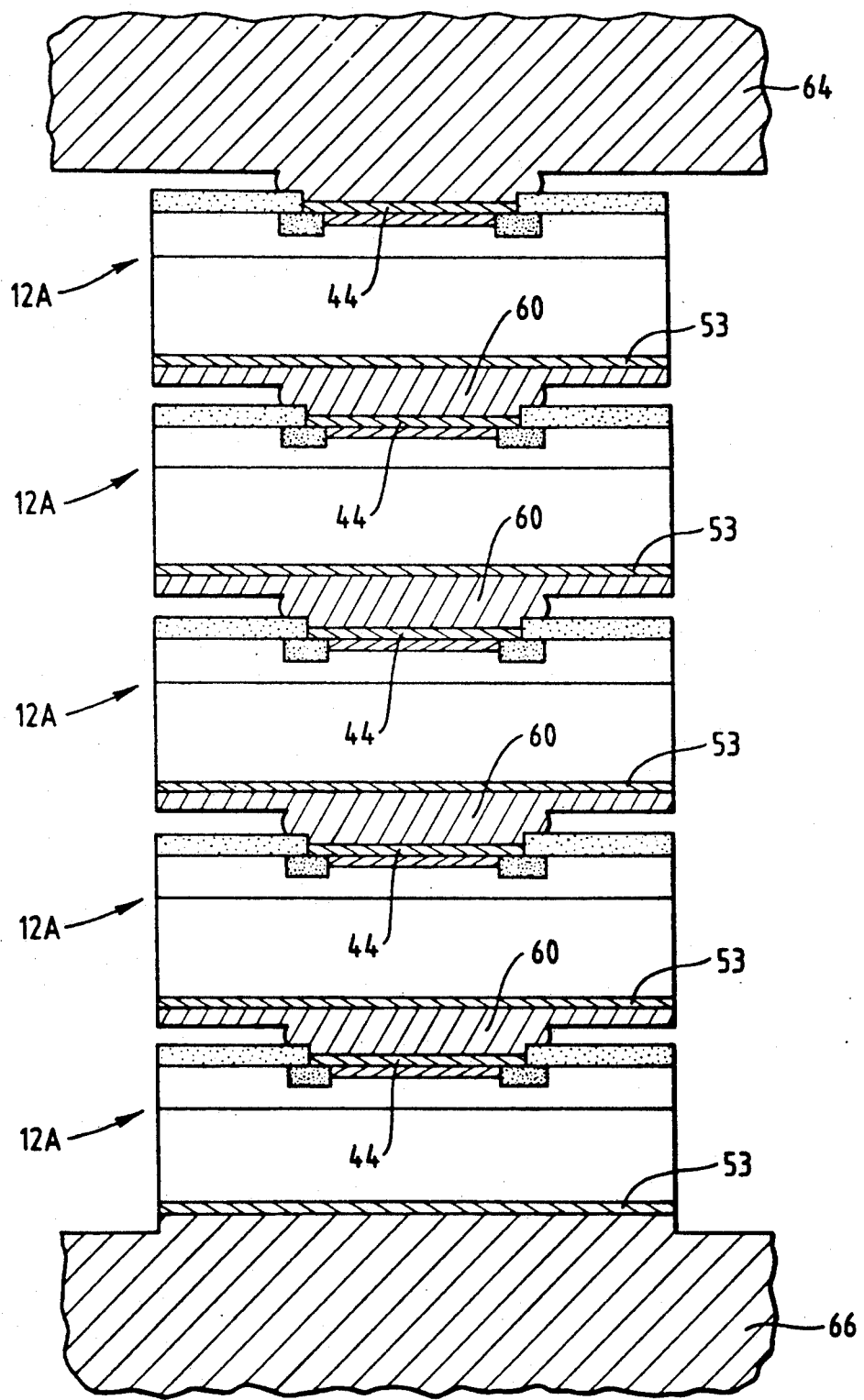
FIG. 5 is a cross-sectional view of a metallurgically bonded stack of Schottky barrier diodes.

In an alternative embodiment, many such diodes 12A can be formed on a single wafer and several such wafers can be formed and placed in a stack. After carefully aligning the diodes of the stack so that the diodes are vertically aligned, one on top of another, the stack of wafers may be heated to metallurgically bond the wafers together. Each stack of diodes may then be cut from the stack of wafers to form a stacked diode die as shown in FIG. 5. Each diode of the stack is metallurgically bonded to the adjacent diodes of the stack as indicated at 60. After encasing the diode stack and the ends of the leads in a glass sleeve, the device may again be heated again so that the leads bond to the bonded stack of diodes and the device is hermetically sealed in the glass sleeve. Coating the device in a glass slurry before heating may also be substituted for a preformed glass sleeve.

It will, of course, be understood that other modifications of the present invention, in its various aspects, will be apparent to those skilled in the art, some being apparent only after study, and others being matters of routine semiconductor fabrication and design. For example, the diffusion barrier 44 may be used also as the Schottky contact layer, eliminating the need for a separate Schottky contact layer. Other embodiments are also possible, their specific designs depending upon the particular application. As such, the scope of the invention should not be limited by the particular embodiments herein described but should be defined only by the appended claims and equivalents thereto.

What is claimed is:

1. A method for fabricating a leaded Schottky barrier diode, comprising the steps of:
   forming a Schottky barrier diode having a diffusion barrier layer of tantalum-silicon-nitride;
   forming a metallization layer disposed over the diffusion barrier layer;
   placing a metal lead in proximity to the metallization layer; and
   heating the area in proximity to the metallization layer and metal lead to a temperature such that the metal lead metallurgically bonds to the metallization layer.

2. A method for fabricating an axially leaded Schottky barrier diode, comprising the steps of:
   forming a diffusion barrier layer of tantalum-silicon-nitride disposed over a first side of a silicon substrate;
   forming a metallization layer disposed over the diffusion barrier layer;
   placing a metal lead in proximity to the metallization layer; and
   heating the area in proximity to the metallization layer and metal lead to a temperature such that the metal lea metallurgically bonds to the metallization layer.

3. The method of claim 2 wherein the metallization layer is heated to a temperature in excess of the melting point of the metallization layer.

4. The method of claim 2 wherein the heating temperature is in excess of 400 degrees C.

5. The method of claim 2 wherein the heating temperature is in excess of 600 degrees C.

6. The method of claim 2 wherein the metallization layer and the metal lead are formed of two different metals and the metallization layer and the metal lead are heated above the eutectic temperature of the two metals.

7. The method of claim 6 wherein the two different metals are silver and aluminum.

8. The method of claim 2 further comprising the steps of:
   forming a second metallization layer disposed over a second side of the substrate;
   placing a second metal lead in proximity to the second metallization layer; and
   heating the area in proximity to the second metallization layer and metal lead to a temperature such that the second metal lead metallurgically bonds to the second metallization layer.

9. The method of claim 8 further comprising the step of forming a second barrier layer over the second side of the substrate prior to forming the second metallization layer wherein the second barrier layer is interposed between the second side of the substrate and the second metallization layer.

10. A method for fabricating an axially leaded Schottky barrier device, comprising the steps of:
    (a) forming a diode by:
       forming a diffusion barrier layer disposed over a first side of a silicon substrate;
       forming a top metallization layer disposed over the diffusion barrier layer; and
       forming a bottom metallization layer disposed over a bottom side of the substrate;
    repeating step (a) to form a plurality of diodes;
    stacking the diodes formed above in step (a) so that the bottom metallization of each diode having an underlying diode of the stack abuts the top metallization layer of the underlying diode;
    heating the stack to a temperature such that abutting top and bottom metallization layers of adjacent diodes of the stack metallurgically bond together;
    placing a top metal lead in proximity to the top metallization layer of the top diode of the stack;
    placing a bottom metal lead in proximity to the bottom metallization layer of the bottom diode of the stack; and
    heating the areas in proximity to the top and bottom leads to a temperature such that the top metal lead metallurgically bonds to the top metallization layer and the bottom metal lead metallurgically bonds to the bottom metallization layer of the top and bottom diodes, respectively.

11. The method of claim 10 further comprising the step of forming a second barrier layer over the second side of the substrate prior to forming the second metallization layer wherein the second barrier layer is interposed between the second side of the substrate and the second metallization layer.

12. The method of claim 10 wherein the metallization layers are heated to a temperature in excess of the melting point of the metallization layers.

13. The method of claim 10 wherein the heating temperature is in excess of 400 degrees C.

14. The method of claim 10 wherein the heating temperature is in excess of 600 degrees C.

15. The method of claim 10 wherein the top and bottom metallization layers are formed of two different metals and the top and bottom metallization layers are heated above the eutectic temperature of the two metals.

16. The method of claim 14 wherein the two different metals are silver and aluminum.

17. A method for fabricating an axially leaded Schottky barrier device, comprising the steps of:
    (a) forming a diode by:
       forming a diffusion barrier layer disposed over a first side of a silicon substrate;
       forming a top metallization layer disposed over the diffusion barrier layer; and
       forming a bottom metallization layer disposed over a bottom side of the substrate;
    repeating step (a) to form a plurality of diodes;
    stacking the diodes formed above in step (a) so that the bottom metallization of each diode having an underlying diode of the stack abuts the top metallization layer of the underlying diode;

placing a top metal lead in proximity to the top metallization layer of the top diode of the stack;

placing a bottom metal lead in proximity to the bottom metallization layer of the bottom diode of the stack; and heating the stack to a temperature such that abutting top and bottom metallization layers of adjacent diodes of the stack metallurgically bond together and such that the top metal lead metallurgically bonds to the top metallization layer and the bottom metal lead metallurgically bonds to the bottom metallization layer of the top and bottom diodes, respectively.

18. The method of claim 17 further comprising the step of forming a second barrier layer over the second side of the substrate prior to forming the second metallization layer wherein the second barrier layer is interposed between the second side of the substrate and the second metallization layer.

19. The method of claim 17 wherein the metallization layers are heated to a temperature in excess of the melting point of the metallization layers.

20. The method of claim 17 wherein the heating temperature is in excess of 400 degrees C.

21. The method of claim 17 wherein the heating temperature is in excess of 600 degrees C.

22. The method of claim 17 wherein the top and bottom metallization layers are formed of two different metals and the top and bottom metallization layers are heated above the eutectic temperature of the two metals.

23. The method of claim 17 wherein the two different metals are silver and aluminum.

24. The method of claim 17 further comprising the step of placing a glass sleeve around the stack of diodes and the ends of the leads before the stack and the leads are heated;

wherein the metallurgically bonding heating step further includes simultaneous heating of the glass sleeve to hermetically seal the stack of diodes and the ends of the leads.

25. The method of claims 10 or 17 wherein the diffusion barrier layer comprises tantalum-silicon-nitride.

* * * * *